United States Patent
Stewart et al.

(10) Patent No.: US 11,205,695 B2
(45) Date of Patent: Dec. 21, 2021

(54) METHOD OF FABRICATING A THICK OXIDE FEATURE ON A SEMICONDUCTOR WAFER

(71) Applicant: Texas Instruments Incorporated, Dallas, TX (US)

(72) Inventors: Elizabeth C. Stewart, Dallas, TX (US); Jeffrey Alan West, Dallas, TX (US); Thomas D. Bonifield, Dallas, TX (US); Jay Sung Chun, Plano, TX (US); Byron Lovell Williams, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 373 days.

(21) Appl. No.: 15/850,999

(22) Filed: Dec. 21, 2017

(65) Prior Publication Data
US 2019/0198604 A1  Jun. 27, 2019

(51) Int. Cl.
| H01L 21/02 | (2006.01) |
| H01L 23/522 | (2006.01) |
| H01L 49/02 | (2006.01) |
| H01L 21/027 | (2006.01) |
| H01L 21/311 | (2006.01) |

(52) U.S. Cl.
CPC .......... *H01L 28/40* (2013.01); *H01L 21/0274* (2013.01); *H01L 21/02164* (2013.01); *H01L 21/02178* (2013.01); *H01L 21/02181* (2013.01); *H01L 21/02183* (2013.01); *H01L 21/31116* (2013.01); *H01L 21/31144* (2013.01); *H01L 23/5223* (2013.01)

(58) Field of Classification Search
CPC ......... H01L 21/02183; H01L 21/02178; H01L 21/02164; H01L 21/02181
See application file for complete search history.

(56) References Cited

U.S. PATENT DOCUMENTS

| 5,294,568 | A | * | 3/1994 | McNeilly | ............ | C04B 41/5346 |
| | | | | | | 148/DIG. 17 |
| 6,294,805 | B1 | * | 9/2001 | Jung | ................. | H01L 27/11507 |
| | | | | | | 257/295 |

(Continued)

FOREIGN PATENT DOCUMENTS

EP    3200231 A1    8/2017

OTHER PUBLICATIONS

PCT Search Report for Application No. PCT/US 2018/065261, dated Mar. 28, 2019.

*Primary Examiner* — Dale E Page
*Assistant Examiner* — Wilner Jean Baptiste
(74) *Attorney, Agent, or Firm* — Andrew R. Ralston; Charles A. Brill; Frank D. Cimino

(57) ABSTRACT

Methods of fabricating a thick oxide feature on a semiconductor wafer include forming a oxide layer having a thickness of at least six micrometers and depositing a photoresist layer on the oxide layer. The oxide layer has a first etch rate of X with a given etchant, the photoresist layer has a second etch rate of Y with the given etchant and the ratio of X:Y is less than 4:1. Prior to etching the photoresist layer and the oxide layer, the photoresist layer is patterned with a gray-scale mask that creates a photoresist layer having a sidewall that forms an angle with the horizontal that is less than or equal to 10 degrees.

14 Claims, 6 Drawing Sheets

(56) References Cited

U.S. PATENT DOCUMENTS

| | | |
|---|---|---|
| 9,525,021 B2 | 12/2016 | West |
| 2002/0084251 A1* | 7/2002 | Ricks .................. B81C 1/00396 216/41 |
| 2005/0227378 A1* | 10/2005 | Moise ............... H01L 21/31116 438/3 |
| 2008/0048287 A1 | 2/2008 | Williams et al. |
| 2012/0190204 A1* | 7/2012 | Graves-Abe ........ H01L 21/3086 438/702 |
| 2016/0133690 A1* | 5/2016 | West ....................... H01L 28/60 257/534 |
| 2017/0194500 A1 | 7/2017 | Li |

* cited by examiner

METHOD OF FABRICATING A THICK OXIDE FEATURE ON A SEMICONDUCTOR WAFER

FIELD OF THE DISCLOSURE

Disclosed embodiments relate generally to semiconductor fabrication and in particular to methods of fabricating a thick oxide feature on a semiconductor wafer.

BACKGROUND

There is a desire to form high voltage integrated circuit capacitors on a semiconductor wafer. However, the presence of a thick oxide feature on the wafer can create problems with downstream processing unless care is taken. For example, if the sidewalls of the thick oxide feature have a slope greater than 30 degrees from the horizontal, the significant topography of the thick oxide may prevent processing of subsequent steps in the flow, such as photoresist coat or metal deposition. A method for achieving the desired slope is needed. Additionally, etching a thick oxide feature, which process may remove greater than 75% of the oxide deposited on the chip, can cause processing problems in the etch tool. Solutions to these problems are necessary to build this thick oxide stack.

SUMMARY

Disclosed embodiments provide methods of fabricating a thick oxide feature, such as a thick dielectric layer for an integrated high-voltage capacitor. An angle with the horizontal that is less than or equal to thirty degrees in the oxide sidewalls is achieved by harmonizing the etch rate of the photoresist and the etch rate of the oxide with the slope of the photoresist. In one example, the photoresist is formed with an angle with the horizontal that is less than or equal to ten degrees while the ratio of the etch rate of the thick oxide to the etch rate of the photoresist is 4:1 or less. A lower ratio will provide a shallower oxide slope. In one example, to avoid oxide etch processing errors, the oxide etch process is broken into a number of segments depending on the thickness of the oxide. Pauses between the etch segments prevent gross contamination of the chamber sidewalls and allow the plasma to re-optimize with each ignition. In one example, an integrated etch stop layer is deposited within the thick oxide stack to ensure proper etch time to clear the full thickness of oxide in light of process non-uniformity, such as oxide thickness variation, both within the wafer and across batches.

In one aspect, an example of a first method of fabricating a thick oxide feature on a semiconductor wafer is disclosed. The method includes forming a oxide layer having a thickness of at least six micrometers, the oxide layer having a first etch rate of X with a given etchant; depositing a photoresist layer on the oxide layer, the photoresist layer having a second etch rate of Y with the given etchant, wherein the ratio of X:Y is less than 4:1; and prior to etching the photoresist layer and the oxide layer, patterning the photoresist layer with a grayscale mask that creates a photoresist layer having a sidewall that forms an angle with the horizontal that is less than or equal to 10 degrees.

In another aspect, an example of a second method of fabricating a thick oxide feature on a semiconductor wafer is disclosed. The method includes forming a oxide layer having a thickness of at least six micrometers; depositing and patterning a photoresist layer on the oxide layer; performing a first timed etch segment of the photoresist layer and the oxide layer, followed by a first pause during which an etching process is halted and the byproducts of the etching process are evacuated; and performing a final etch segment of the photoresist layer and the oxide layer that stops on an etch stop layer.

In yet another aspect, an example of a third method of fabricating a thick silicon oxide feature on a semiconductor wafer is disclosed. The method includes forming a silicon oxide layer having a thickness of at least six micrometers, the silicon oxide layer having a first etch rate of X with a given etchant; depositing a photoresist layer on the silicon oxide layer, the photoresist layer having a second etch rate of Y with the given etchant, wherein the ratio of X:Y is less than 4:1; prior to etching the photoresist layer and the silicon oxide layer using the etchant, patterning the photoresist layer with a grayscale mask; and etching the photoresist layer and the silicon oxide layer using a plasma etching process to form the thick silicon oxide feature, wherein the etching is performed in a plurality of etch segments that are separated by pauses during which the plasma etching process is halted and the byproducts of the plasma etching process are evacuated.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Figure 1:
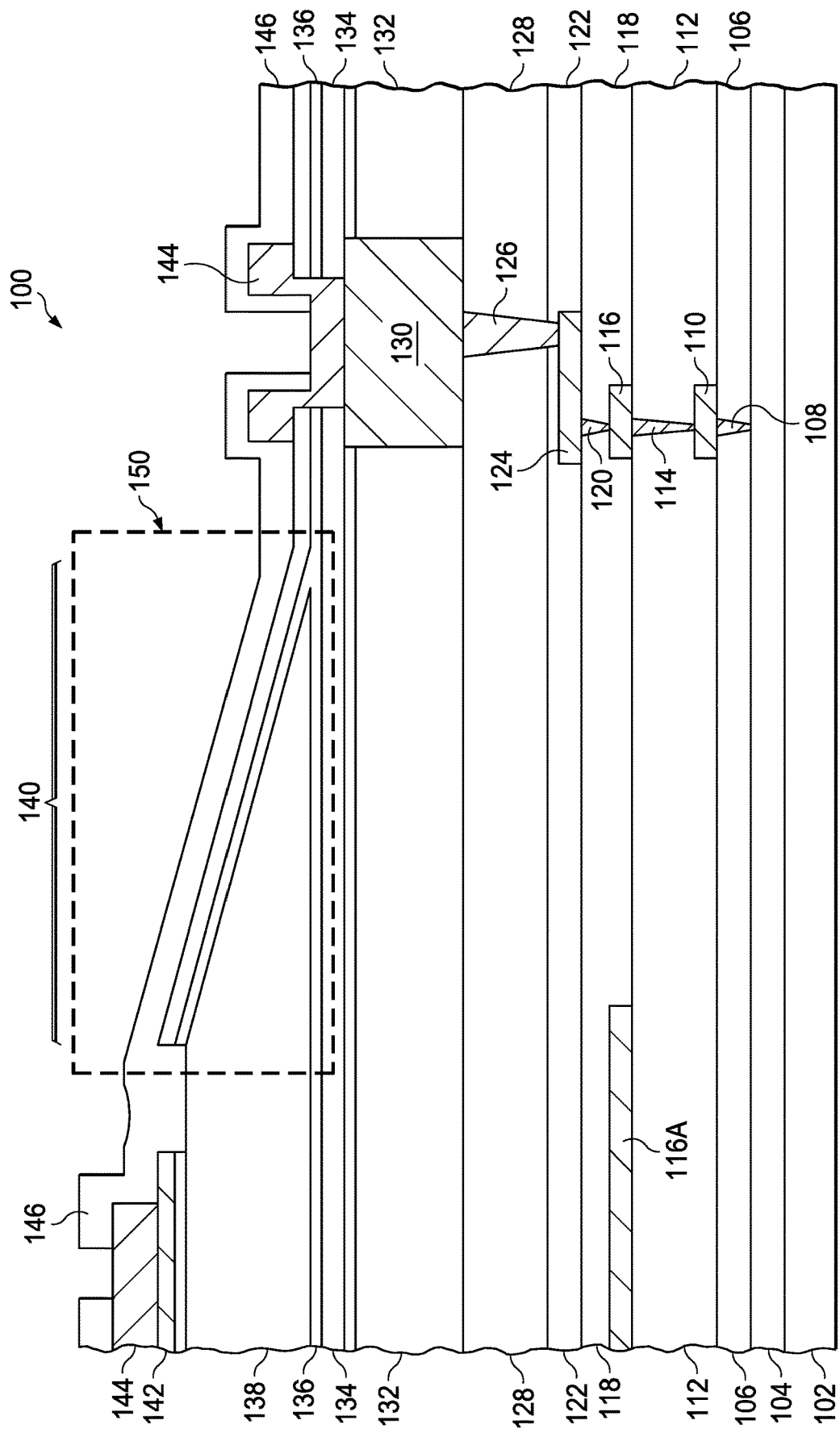
FIG. 1 depicts a cross-sectional view of a portion of a high voltage or an extra-high voltage capacitor arrangement which can be formed using an embodiment of the disclosure.

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

An aspect of the present application provides for methods and apparatus to fabricate a high voltage or extra-high voltage integrated capacitor on a wafer within a semiconductor fabrication process flow. Within this application and as currently described in the power circuits industry, low voltage is considered as below 50 Volts, high voltage is defined as a voltage greater than 50 Volts and less than 5,000 volts. Extra-high voltage is a voltage greater than 5,000 Volts to less than about 20,000 Volts. Integrated capacitors that utilize the disclosed thick oxide features are directed at high voltage and extra-high voltage applications. Additional details regarding the fabrication of a high voltage integrated capacitor on a wafer can be found in U.S. Pat. No. 9,525,021, issued Dec. 20, 2016, which shares a number of inventors with the present application and which is incorporated by reference in its entirety.

The disclosed fabrication technique utilizes a thick dielectric layer, called a "MESA" formation, formed in the upper portions of a semiconductor wafer, and the thick dielectric layer is used to increase the distance between the upper and lower capacitor plates formed on the wafer. Because the thick dielectric layer rises vertically above the remainder of the surface of the substrate and has a flat upper surface, it appears as a mesa shape. Throughout the detailed description, well known processes or operations are identified but not shown in full detail to prevent from obscuring the aspects of the present application. It will be recognized that aspects of the present application can be fabricated without one or more of the specific details or by using another known method in a fabrication step. Alternative arrangements are contemplated that can be formed in addition to the example arrangements described for illustration purposes herein, and these alternatives form additional novel arrangements that are contemplated as providing additional aspects of the present application, and these alternative arrangements fall within the scope of the appended claims.

In order to integrate the patterning and etching of a highly topographic thick oxide stack (MESA) to create a high voltage isolation capacitor, the process integration must overcome several challenges:

A steep oxide sidewall creates significant challenges for subsequent layer processing. As noted above, the MESA oxide should have a shallow sidewall slope to allow deposition of subsequent layers. A typical dry oxide etch will create steep sidewalls and cannot be used for this application.

The long oxide etch, which can clear more than 75% of the oxide from the wafer, can cause overheating of the chamber, which in turn can lead to accelerated oxide accumulation on the chamber walls and create problems for chamber clean efficiency. Turn-around time between successive wafers becomes a problem.

As oxide is removed from more than 75% of the wafer during etch, the wafer bow changes due to the removal of this thick compressive oxide from the wafer. In plasma etching, the etching tool will optimize the process to minimize reflected power within the etching chamber. However, as the bow of the wafer changes, plasma faults become more likely from the increased reflected power.

Incomplete removal of the oxide stack leads to parametric opens and wafer scrap. In one example, the oxide etching process needs to expose portions of the outermost metal layer in order to provide coupling thereto. Due to variations in the thickness of the thick oxide across the wafer, the desired depth of oxide may not be removed in some regions of the wafer, causing a lack of contact to the outermost metal layer. Any semiconductor chips on which this occurs will not operate properly and are scrapped.

All films within the oxide stack must be compatible with high voltage isolation or the device is at risk of an early failure due to lateral breakdown, e.g., discharge. Although silicon nitride is commonly utilized as an etch stop layer for oxides, the use of silicon nitride in a high-voltage isolation capacitor can cause early breakdown due to discharge through the silicon nitride layer.

FIG. 1 depicts an example of a cross-section of a wafer 100 containing a thick oxide feature, which in this example is a high-voltage integrated capacitor that is formed according to one or more embodiments of the disclosed methods. Wafer 100 includes a semiconductor substrate 102, on which a number of processing layers 104 have been formed. The processing layers 104 may contain various devices, such as MOS transistors, bipolar transistors, field effect transistors (FETs), diodes, resistors, inductors, capacitors and the like, which are not specifically shown, as these components are not relevant to the disclosed processes. A pre-metal dielectric layer 106 overlies the processing layers 104.

The components in the processing layer can be interconnected using metal layers and inter-metal dielectric layers, with the metal layers being connected to one another and to the substrate using vias and contacts to connect the layers. The wafer in FIG. 1 contains four metal layers: metal-1 110, metal-2 116, metal-3 124 and metal-4 130, which are separated from each other and following layers by inter-metal dielectric IMD1 112, inter-metal dielectric IMD2 118, inter-metal dielectric IMD3 122, inter-metal dielectric VIA4 128 and inter-metal dielectric IMD4 132 and coupled together by vias 108, 114, 120, 126. In the embodiment shown, the bottom plate 116A of the high-voltage integrated capacitor is formed as part of the metal-2 layer 116, although it should be recognized that the bottom plate of the capacitor can also be formed from another of the metallization layers without deviating from the disclosed embodiments. It will also be recognized that the number of metallization layers is not relevant to the disclosed methods and can differ from that shown in this example. In one example, metal-2 layer 116 and bottom plate 116A can be, for example, aluminum or copper or alloys thereof, the metal being the one used in the particular semiconductor fabrication process. Single and dual damascene copper or copper alloy materials can be used to form metal-2 layer 116.

Overlying the completed metallization layers is a sub-etch stop layer (sub-ESL) 134, which in one embodiment is formed of silicon dioxide. Sub-etch stop layer 134 is followed by etch stop layer (ESL) 136. The etch stop layer is selected to meet two specific characteristics: the ESL should not reduce high-voltage isolation capability and should provide a strong signal during etch to enable a clear endpoint. In one example, silicon oxynitride is utilized as the etch stop layer and the layer is 3000 Å thick. In one embodiment, aluminum oxide is utilized for ESL 136. In one embodiment the thickness of ESL 136 is in the range of 2500 to 4500 Å thick. A thick oxide 138 has been formed overlying ESL 136, as will be discussed in greater detail below. In the region overlying lower plate 116A, thick oxide 138, which is also referred to herein as a MESA oxide, has a thickness of six micrometers or more, depending on the capacitance desired in the capacitor. The thick oxide 138 has been removed from the region on the right-hand side of FIG. 1, so that contact can be made to metal-4 130, while the sidewalls 140 of the thick oxide 138 have a slope that is no more than thirty degrees from the horizontal.

Overlying the thick oxide 138 and the bottom plate 116A of the capacitor is the upper plate 142. In one embodiment, upper plate 142 has a thickness between about 6000 Å to 13000 Å. Upper plate 142 can be, in one example method, sputtered on the wafer, patterned and then etched. The upper plate 142 is generally comprised of at least two metal layers, a refractory metal barrier layer such as TiN, TiW, or TaN, and then an aluminum, aluminum-copper alloy, or a copper layer. In the example shown in FIG. 1, top metal layer 144 is then deposited overlying the upper plate 142, which in one embodiment is an aluminum cap; at the same time a second top metal layer 144 is formed overlying a contact to the metal-4 130. Finally, a protective overcoat 146 is provided overlying the entire structure. In one embodiment, the protective overcoat PO 146 includes silicon oxynitride followed by a layer of TEOS and a high-density polyethylene (HDP). Formation of the desired slope for the MESA sidewalls will now be described.

Figure 2:
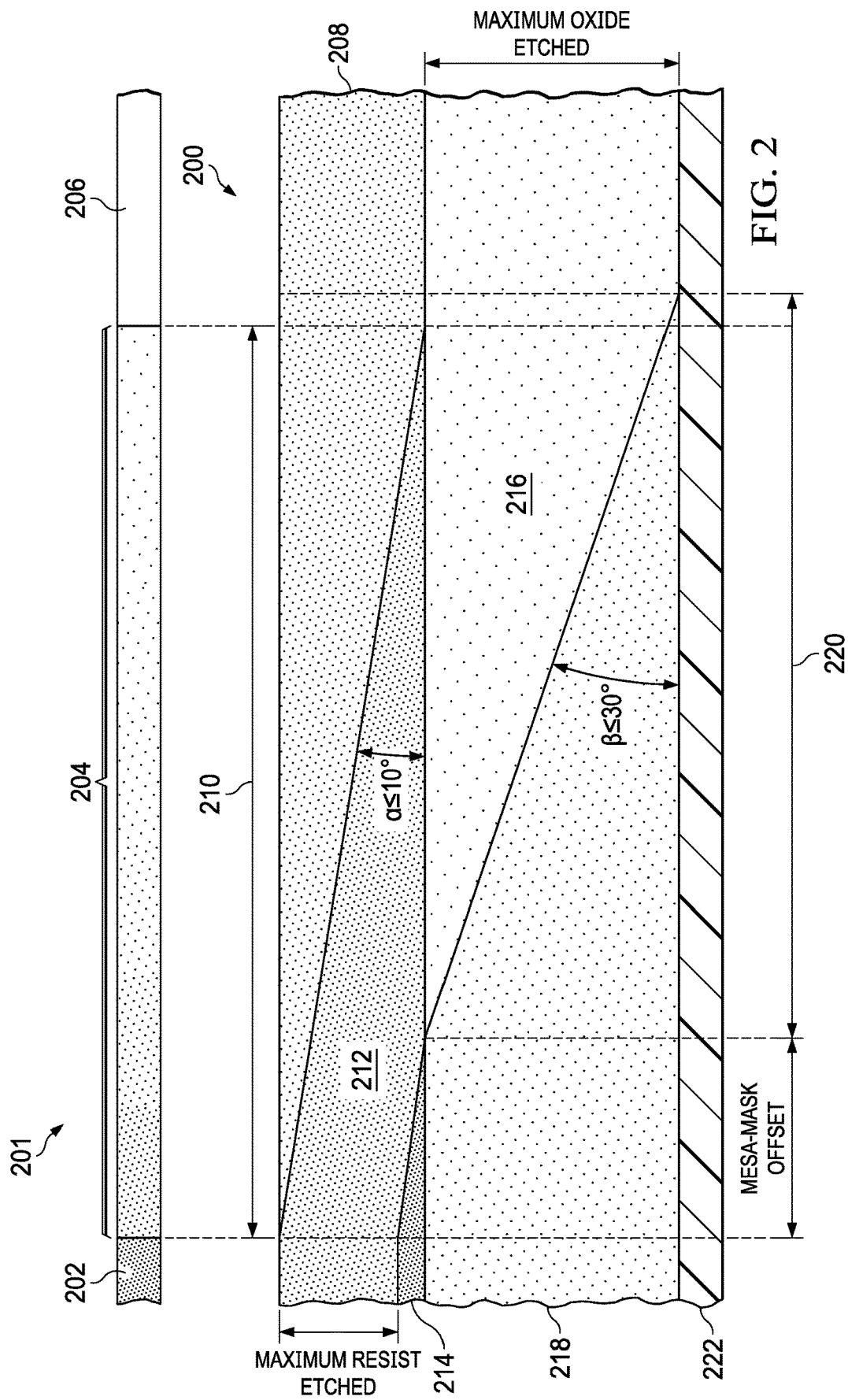
FIG. 2 depicts a cross-sectional view of the photoresist and the thick oxide layer at the sidewalls and highlights portion of each that are removed by patterning and etching of the layers according to an embodiment of the disclosure.

FIG. 2 schematically depicts the changes to the sidewall region as the photoresist is first developed and after the etching process according to an embodiment of the disclosure. Cross-section 200 of a semiconductor wafer is taken from the section of FIG. 1 that is outlined by box 150 and includes the slope between the top of the MESA and the base around the MESA. After a MESA oxide is deposited to a desired thickness, a layer of photoresist is deposited on the MESA oxide and patterned using a photomask, such as mask 201. The photomask 201 has three separate regions, which are shown in FIG. 2: region 202 overlies the area for the top of the MESA oxide stack and is fully chromed; region 206 overlies the area where no MESA material is desired and is fully clear. The transition region 204 between regions 202 and 206 on the photomask transitions from full chrome on the portion closest to region 202 to no chrome on the portion closest to region 206. The portion of the figure shown below this mask region depicts both the oxide and photoresist that remain after each of the developing process and the etching process, as well as the photoresist and oxide that are removed by each process.

The photoresist layer begins as a flat layer, but after exposure of the wafer to light through mask 201 and the developing process, the resist shown as region 208 has been removed, leaving a sloped region having length 210 in the resist between the MESA and the desired base. Following the developing process, the oxide on the right-hand side of this figure is exposed and will be etched for the entire etch period to remove the maximum amount of oxide down to the etch stop layer 222. The oxide underlying the small area on the left-hand side of the figure where no resist was removed will not be etched at all; and the portion of the oxide underlying the slope in the resist will be progressively etched as the photoresist above this layer is removed. When the etching process is completed, region 212 of the photoresist has been removed and only region 214 of the photoresist remains to protect the underlying oxide layer. During this etching process, oxide region 216 is removed, leaving oxide region 218, which has a post-etch slope in oxide over a distance 220. It can be noted that there is an offset between the top of the slope that was formed in the photoresist after the development process and the top of the slope that was formed in the oxide after the etching process, which is due, of course, to the difference in etch rates between the photoresist and oxide such that the total thickness of resist is not fully consumed by the etch process.

As noted previously, for manufacturability after the MESA oxide feature has been etched, it is desirable to provide an angle β between the post etch slope in the oxide and the horizontal that is no greater than 30°. In order to obtain this desired angle, the angle α formed between the post pattern slope in the resist and the horizontal should be less than 10° and the ratio of the etch rate for the oxide, $R_{OXIDE}$, compared to the etch rate for the resist, $R_{RESIST}$, i.e., $R_{OXIDE}$:$R_{RESIST}$, should be less than 4:1. Note that the drawings are not drawn to scale and the angles shown may not be correct. Providing a ratio lower than 4:1 will achieve a shallower oxide slope and provide less resistance to flow of subsequent layers. It will be understood also that the distance allowed for the transition region 204 should be sized according to the final thickness of the MESA oxide layer and the slope of the oxide. In one example embodiment, $R_{OXIDE}$:$R_{RESIST}$ was 3.9:1 for an 11 µm oxide. In one example embodiment, the $R_{OXIDE}$:$R_{RESIST}$ was 2.6:1 for an 8 µm oxide. In one embodiment, an angle of 20.0° in the oxide sidewall was achieved.

As noted previously, another issue to be addressed in providing integrated high voltage isolation capacitors is the fact that the long oxide etching process that may clear 75 percent or more of the oxide can cause overheating of the chamber. Excess heat generated during etch can lead to an accelerated oxide accumulation on the chamber walls, which creates problems for efficiency in chamber cleaning. Additionally, as a thick oxide is removed from 75 percent or more of the wafer, the wafer stress changes, potentially causing plasma faults from drifts in reflected power. Performing the long etch in a number of segments that are separated by pauses in the process provides relief from many of these issues.

In one embodiment, the oxide is etched using a plasma etching process. The plasma is generally created by a discharge between two electrodes, the space between which is filled with the reacting gases. The plasma is maintained using energy and a vacuum. Between segments of active etching, the energy to form the plasma is turned off, allowing both the chamber and the wafer inside the chamber to cool, while the oxide that has been removed from the wafer is cleared from the chamber. When the plasma chamber is re-energized, the plasma etching tool automatically optimizes the chamber for reflected power. This re-optimization with each segment will take into account the changes that have occurred to the wafer during the previous etching segments and allow better adjustment to the changing profile of the wafer. Although adding time to a semiconductor process is rarely if ever a first choice, the results of providing the pauses are less accumulation of oxide on the chamber walls and a decreased number of faults. In one embodiment, the pauses between segments of plasma etching can be in the range of 15 to 60 seconds.

Figure 3A:
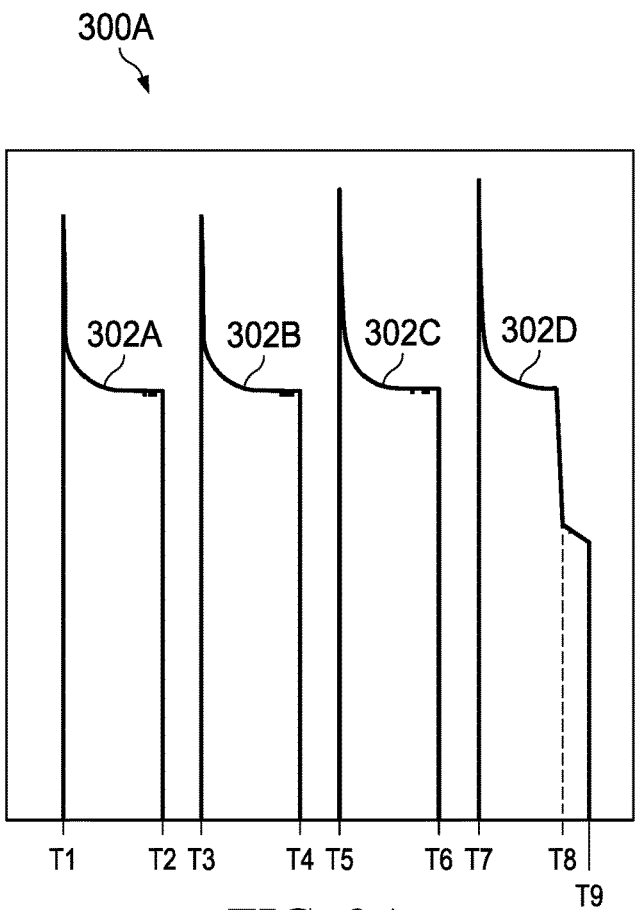
FIG. 3A depicts the output signal obtained from the etch chamber during etch segments utilized in the disclosed etching process according to an embodiment of the disclosure.

FIG. 3A tracks an output signal 300A from an example plasma etching tool during an entire etching process. The X-axis in this figure denotes the process time while the Y-axis denotes the amount of oxide detected in the chamber, which reflects the material being etched. When the etching process is initiated at time T1, the level of oxide creates a large spike, then evens off to a relatively steady state, forming curve 302A. This steady state continues until the plasma etching process is halted at time T2, at which time the oxide level in the chamber quickly drops to zero as the chamber is cleared. A pause occurs from time T2 until time T3, which can be, for example, 30 seconds. At time T3, the plasma etching process is re-started, as reflected in another spike, which then settles down to a near steady state until time T4, creating curve 302B. After another pause from time T4 until time T5, the plasma etching process is performed from time T5 to time T6 with similar results, forming curve 302C. Each of these initial etching periods is a timed etching process. During the fourth segment of the plasma etching process from time T7 to T9, the etch stop layer, which in at least one embodiment is SiON, is encountered at time T8. At this juncture, the amount of oxide in the chamber drops as more nitride is released by the etching process. The etching process can then be continued for a configurable amount of overetch time to ensure that the optimal amount of oxide is removed.

Figure 3B:
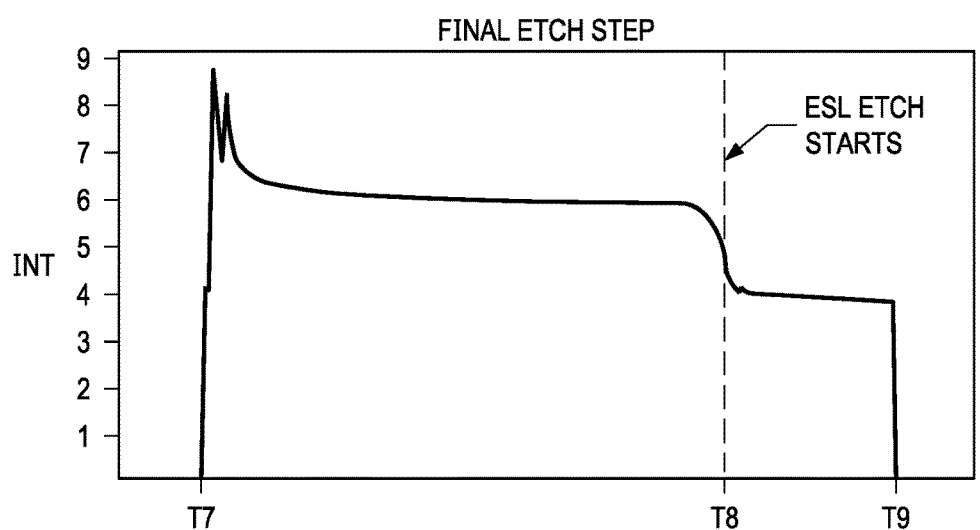
FIG. 3B depicts an enlarged view of the output signal obtained in the final segment of FIG. 3A according to an embodiment of the disclosure.

FIG. 3B is an reproduction of curve 302D from the final segment of this multi-part process with a different scale. Once the signal of oxide in the chamber is reduced below a threshold value, this drop in signal indicates the start of the etching of the etch stop layer. The etching process is continued for a specific amount of overetch time, which in one embodiment is 70 seconds. At that point, the etching of the MESA oxide is considered complete.

Figure 4:
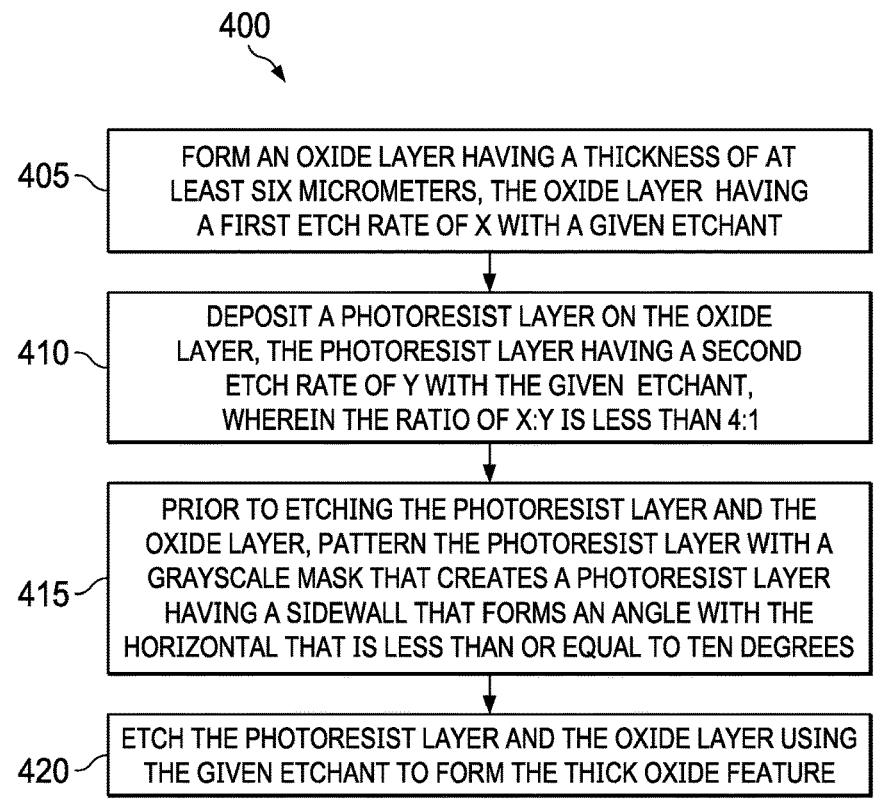
FIG. 4 depicts a flowchart of a method of fabricating a thick oxide feature on a semiconductor wafer according to an embodiment of the disclosure.

FIG. 4 depicts a flowchart of a method 400 of fabricating a thick oxide feature on a semiconductor wafer according to an embodiment of the disclosure. The method begins with forming 405 an oxide layer having a thickness of at least six micrometers, with the oxide layer having a first etch rate of X with a given etchant. In one embodiment, the oxide layer is silicon oxide having a thickness of ten micrometers. In one embodiment, the oxide layer is one of aluminum oxide, tantalum pentoxide, hafnium oxide or other oxide. Since the thick oxide feature being formed has a height of six micrometers or more, it is beneficial to have sidewalls with no more than a 30 degree angle with the horizontal in order for subsequently deposited materials to flow properly over and around the feature. The method deposits 410 a photoresist layer on the oxide layer, with the photoresist layer having a second etch rate of Y with the given etchant, where the ratio of X:Y is less than 4:1.

Prior to etching the photoresist layer and the oxide layer, the method patterns 415 the photoresist layer with a grayscale mask that creates a photoresist layer having a sidewall that forms an angle with the horizontal that is less than or equal to 10 degrees. In order to create an appropriate grayscale mask, the width of slope region that allows the sidewall angle to be less than or equal to 10 degrees is determined and a mask having a transition region 204 with a gradient that goes from fully chrome near the MESA structure to fully clear near the base of the MESA structure is created. When the photoresist is exposed through the grayscale mask, a sloped region of photoresist is left with the desired angle.

Figure 4A:
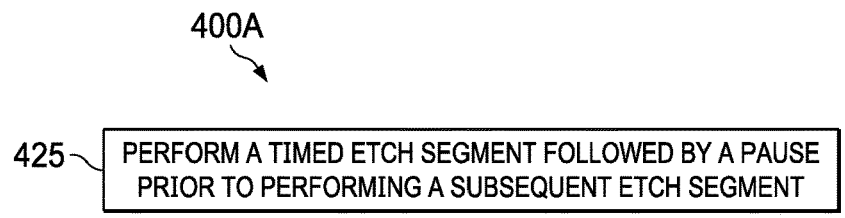
FIGS. 4A-4C depict further elements of a method of fabricating a thick oxide feature on a semiconductor wafer according to an embodiment of the disclosure.

The method continues with etching 420 the photoresist layer and the oxide layer using the given etchant to form the thick oxide feature. The combination of a photoresist layer having a 10 degree or less angle with the horizontal and the relationship between the etch rates of the photoresist and the oxide layer will produce the desired MESA sidewalls that have a slope with the horizontal that is 30 degrees or less. In one embodiment, the etching of the photoresist layer and the oxide layer is performed using a number of etch segments that are separated by pauses in the etching process. In one example shown in FIG. 4A, method 400A performs 425 a timed etch segment, followed by a pause prior to performing a subsequent etch segment. The element of a timed etch segment followed by a pause prior to performing a subsequent etch segment can be performed two or more times if desired to obtain the desired MESA formation.

Figure 4B:
Figure 4C:

As previously mentioned, it can be difficult to obtain the desired level of oxide clearance across the entire wafer using only a timed etching process. In one embodiment shown in FIG. 4B, method 400B forms 430 an etch stop layer underneath the oxide layer. In one example, the etch stop layer is silicon oxynitride. When an etch stop layer is present, method 400C performs 435 a final etch segment that stops on the etch stop layer, as shown in FIG. 4C. If no etch stop layer is utilized, the etch process can conclude with performing a final timed etch segment that completes the method.

Figure 5:
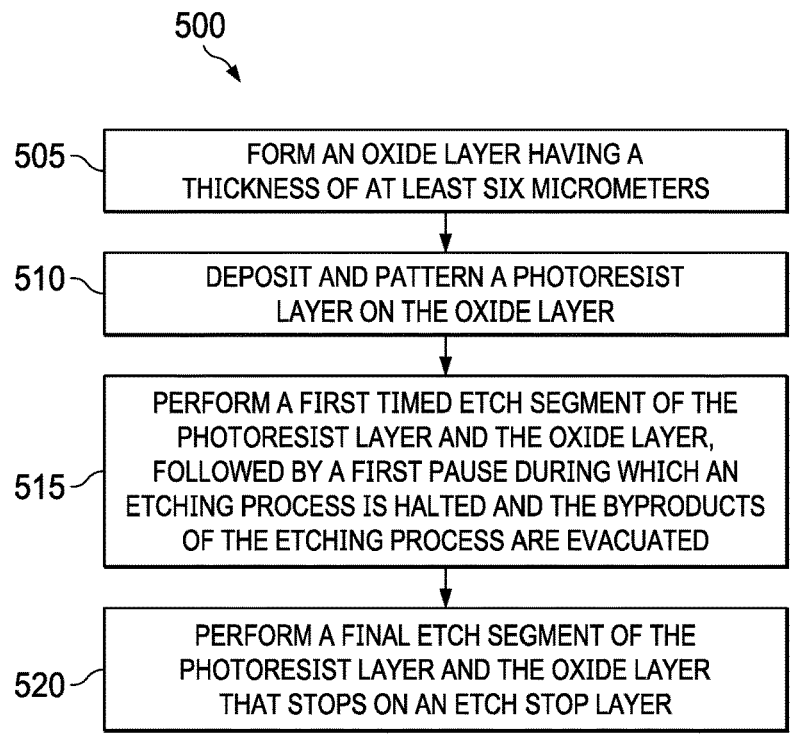
FIG. 5 depicts a flowchart of a method of fabricating a thick oxide feature on a semiconductor wafer according to an embodiment of the disclosure.

FIG. 5 depicts a flowchart of a method 500 of fabricating a thick oxide feature on a semiconductor wafer according to an embodiment of the disclosure. Method 500 again starts with forming 505 a oxide layer having a thickness of at least six micrometers. The thick oxide layer in this and the other embodiments can be deposited as a single layer or can comprise multiple layers. A photoresist layer is then deposited and patterned 510 on the oxide layer.

A first timed etch segment of the photoresist layer and the oxide layer is performed 515, followed by a first pause. During the first pause, the etching process is halted and the byproducts of the etching process are evacuated. While the etching process is halted, the wafer and chamber are allowed to cool, although no specific cooling measures are necessary. The pause can range in time from 15 to 60 seconds, depending on the process. A final etch segment of the photoresist layer and the oxide layer is performed 520 that stops on an etch stop layer.

Figure 5A:
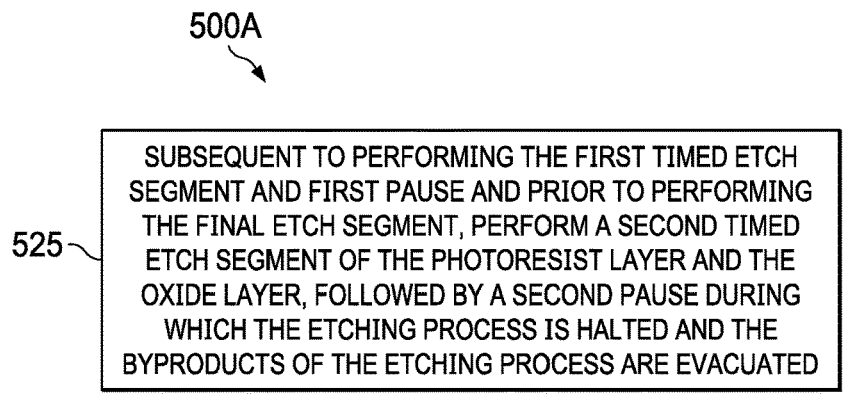
FIGS. 5A-5B depict further elements of a method of fabricating a thick oxide feature on a semiconductor wafer according to an embodiment of the disclosure.

In one embodiment, shown in FIG. 5A, subsequent to performing the first timed etch segment and first pause and prior to performing the final etch segment, method 500A performs 525 a second timed etch segment of the photoresist layer and the oxide layer, followed by a second pause during which the etching process is halted and the etching byproducts are evacuated. In one embodiment, three timed etch segments are each followed by a pause, prior to performing the final etch segment to an etch stop layer. The second timed etch segment and the second pause can be identical to the first timed etch segment and the first pause, although this is not a requirement. Although not specifically shown, additional timed etch segments can be performed if desired, each followed by a pause in the etching process to allow the byproducts of the etching process to be evacuated and the wafer and chamber to cool.

Figure 5B:
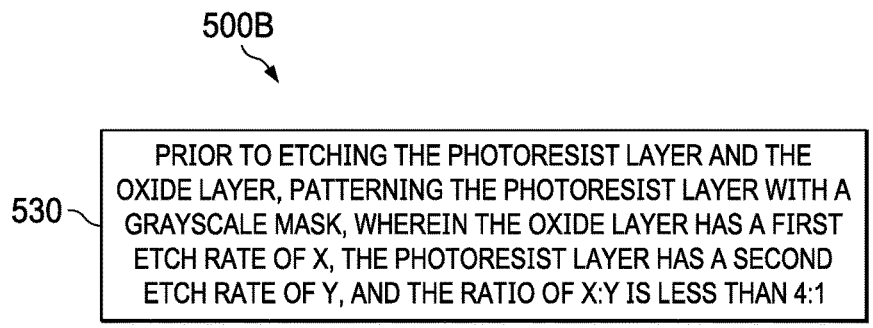

In one embodiment shown in FIG. 5B, prior to etching the photoresist layer and the oxide layer, method 500B patterns 530 the photoresist layer with a grayscale mask. In this embodiment, the oxide layer has a first etch rate of X, the photoresist layer has a second etch rate of Y, and the ratio of X:Y is less than 4:1.

Figure 6:
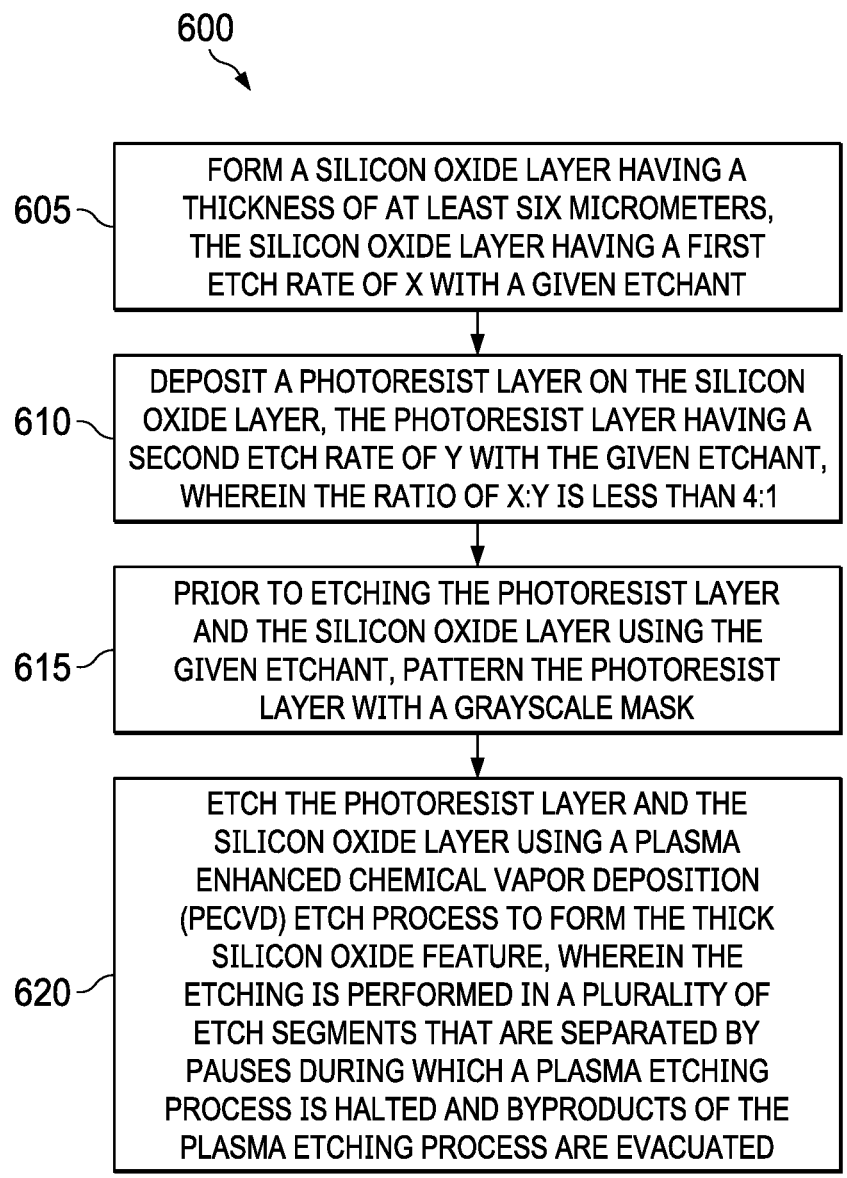
FIG. 6 depicts a flowchart of a method of fabricating a thick oxide feature on a semiconductor wafer according to an embodiment of the disclosure.

FIG. 6 depicts a flowchart of a method 600 of fabricating a thick oxide feature on a semiconductor wafer according to an embodiment of the disclosure. Method 600 starts with forming 605 a oxide layer that has a thickness of at least six micrometers and a first etch rate of X with a given etchant. A photoresist layer is deposited 610 on the oxide layer, the photoresist layer having a second etch rate of Y with the given etchant and the ratio of X:Y is less than 4:1.

Prior to etching the photoresist layer and the oxide layer using the given etchant, the method patterns 615 the photoresist layer with a grayscale mask. The grayscale mask contains a region that has a gradient that changes from fully chromed to no chrome across the region. Finally, the method etches 620 the photoresist layer and the oxide layer using a plasma etching process to form the thick oxide feature. The etching is performed in a plurality of etch segments that are separated by pauses during which the plasma etching process is halted and the byproducts of the plasma etching process are evacuated.

Methods for fabricating a thick oxide feature on a semiconductor wafer have been disclosed. These methods allow the MESA feature to have a profile that allows subsequent processing to take place. Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A method of fabricating an integrated circuit comprising:
   forming an oxide layer between an etch stop layer and an upper metal plate, the oxide layer having a thickness of at least six micrometers, the oxide layer having a first etch rate of X with a given etchant;
   depositing a photoresist layer over the oxide layer, the photoresist layer having a second etch rate of Y with the given etchant, wherein the ratio of X:Y is less than 4:1;
   prior to etching the photoresist layer and the oxide layer, patterning the photoresist layer with a grayscale mask, thereby creating a sloped photoresist layer having a sidewall that forms an angle with respect to the substrate surface that is less than or equal to 10 degrees; and
   etching the photoresist layer and the oxide layer using a plurality of timed etch segments, each etch segment removing a portion of the oxide layer and being separated from a subsequent etch segment by a pause during which the etch process is halted.

2. The method as recited in claim 1 wherein the ratio of X:Y is less than 3:1.

3. The method as recited in claim 1 further comprising forming an etch stop layer underneath the oxide layer.

4. The method as recited in claim 3 further comprising performing a final etch segment that stops on the etch stop layer.

5. The method as recited in claim 4 wherein the oxide layer comprises a material chosen from the group comprising silicon oxide, aluminum oxide, tantalum oxide and hafnium oxide.

6. A method of fabricating an integrated circuit, comprising:
   forming an oxide layer over an etch stop layer;
   depositing and patterning a photoresist layer over the oxide layer;
   performing a plurality of etch segments, each etch segment etching the photoresist layer and the oxide layer using a same etch process, each segment followed by a pause during which the etch process is halted and byproducts of the etch process are evacuated, the etch process etching the oxide layer before and after each pause; and
   performing a final etch segment of the photoresist layer and the oxide layer that stops on the etch stop layer.

7. The method as recited in claim 6 wherein the etch process utilizes a plasma etch process.

8. The method as recited in claim 6 wherein the etch process re-optimizes the plasma etch process after each pause.

9. The method as recited in claim 6 wherein the pauses last between 15 and 60 seconds.

10. The method as recited in claim 6 further comprising, prior to etching the photoresist layer and the oxide layer, patterning the photoresist layer with a grayscale mask.

11. The method as recited in claim 10 wherein the oxide layer has a first etch rate of X, the photoresist layer has a second etch rate of Y, and the ratio of X:Y is less than 4:1.

12. The method as recited in claim 6 wherein the etch stop layer comprises silicon oxynitride.

13. The method as recited in claim 6 wherein the oxide layer comprises a material chosen from the group comprising silicon oxide, aluminum oxide, tantalum oxide and hafnium oxide.

14. A method of fabricating an integrated capacitor, the method comprising:
   forming a silicon oxide layer having a thickness of at least six micrometers, the silicon oxide layer having a first etch rate of X with a given etchant;
   depositing a photoresist layer directly on the silicon oxide layer, the photoresist layer having a second etch rate of Y with the given etchant, wherein the ratio of X:Y is less than 4:1;
   prior to etching the photoresist layer and the silicon oxide layer using the etchant, patterning the photoresist layer with a grayscale mask; and
   etching the photoresist layer and the silicon oxide layer using a plasma etching process to form a sloped silicon oxide feature, wherein the etching is performed in a plurality of etch segments that are separated by pauses during which the plasma etching process is halted and the byproducts of the plasma etching process are evacuated, each of the etch segments etching the silicon oxide layer.

* * * * *